United States Patent
Griffin et al.

(10) Patent No.: US 11,480,603 B2
(45) Date of Patent: Oct. 25, 2022

(54) SECONDARY MONITORING SYSTEM FOR A MACHINE UNDER TEST

(71) Applicant: The Boeing Company, Chicago, IL (US)

(72) Inventors: Steven F Griffin, Kihei, HI (US); Matthew Scot Stauffer, Ladson, SC (US); Matthew Novick, Philadelphia, PA (US); Daryn D Kono, Pukalani, HI (US); Kevin P Moore, Pukalani, HI (US)

(73) Assignee: THE BOEING COMPANY, Chicago, IL (US)

( * ) Notice: Subject to any disclaimer, the term of this patent is extended or adjusted under 35 U.S.C. 154(b) by 406 days.

(21) Appl. No.: 16/825,626

(22) Filed: Mar. 20, 2020

(65) Prior Publication Data
US 2021/0293875 A1 Sep. 23, 2021

(51) Int. Cl.
*G01R 31/26* (2020.01)
*G01R 31/3193* (2006.01)
*G01R 31/28* (2006.01)

(52) U.S. Cl.
CPC ..... *G01R 31/2612* (2013.01); *G01R 31/2837* (2013.01); *G01R 31/31935* (2013.01)

(58) Field of Classification Search
None
See application file for complete search history.

(56) References Cited

U.S. PATENT DOCUMENTS

| | | | | |
|---|---|---|---|---|
| 8,174,402 B2* | 5/2012 | Bouse | ............... | G05B 23/0232 |
| | | | | 702/182 |
| 8,636,670 B2* | 1/2014 | Ferren | ................... | G08B 21/06 |
| | | | | 600/300 |
| 10,921,801 B2* | 2/2021 | Cella | ..................... | G06N 7/005 |
| 2006/0181427 A1* | 8/2006 | Bouse | ............... | G05B 23/0232 |
| | | | | 340/657 |
| 2009/0287109 A1* | 11/2009 | Ferren | ................. | A61B 5/0031 |
| | | | | 600/549 |
| 2018/0284741 A1* | 10/2018 | Cella | .................... | G05B 13/028 |

* cited by examiner

*Primary Examiner* — Jermele M Hollington
(74) *Attorney, Agent, or Firm* — Vivacqua Crane, PLLC

(57) ABSTRACT

A testing system for monitoring a machine under test is disclosed and includes one or more high frequency sensors configured to generate a sensor signal that is representative of an operating parameter of the machine. The high frequency sensors have a required high frequency sampling rate. The testing system also includes a notification device configured to generate a notification indicating the operating parameter monitored by the high frequency sensors has exceeded a predefined threshold value and a data acquisition control module configured to monitor the high frequency sensors at a first sampling rate. The testing system also includes a monitoring control module in electronic communication with the notification device. The monitoring control module is configured to monitor the high frequency sensors at a second sampling rate that is greater than the first sampling rate and at least equal to the required high frequency sampling rate.

20 Claims, 5 Drawing Sheets

SECONDARY MONITORING SYSTEM FOR A MACHINE UNDER TEST

INTRODUCTION

The present disclosure relates to monitoring systems. More particularly, the present disclosure is directed towards a secondary monitoring system for a machine under test that samples a signal at a higher rate when compared to a primary data acquisition system.

BACKGROUND

A data acquisition system records and transmits data collected at a remote or inaccessible site and transmits the data to another location for monitoring and analysis. The data recoded by the data acquisition system may be relayed using any number of approaches such as, for example, radio signals, infrared signals, or by a data bus. However, some wireless systems and data buses may have a relatively low bandwidth, which limits the amount of data that may be sent in a given amount of time. As a result, some data acquisition system may not be capable of monitoring a system in real-time at a sufficient bandwidth.

In one example, the data acquisition system is used in a vehicle such as an aircraft and monitors a variety of operating parameters such as the vibratory acceleration for a motor that is part of the vehicle. If the data is transferred between the vehicle to the data acquisition system over a wireless network having a relatively low bandwidth, then there is a possibility that the vibratory acceleration of the motor may not be monitored in real-time. Accordingly, sometimes an individual may continue to operate the vehicle after the motor has exceeded its vibratory acceleration threshold without adjusting the operating parameters of the motor to reduce the vibratory acceleration. This is because the individual has not received any indication that the motor is operating above its vibratory acceleration threshold. Therefore, the individual is unaware that the motor is operating above the threshold. Operating the motor above its vibratory threshold may cause issues with the vehicle, as well as interfere with other instrumentation on the vehicle.

SUMMARY

According to several aspects, a testing system for monitoring a machine under test is disclosed. The testing system includes a plurality of sensors configured to collect data representing an operating parameter of the machine. The plurality of sensors include one or more high frequency sensors configured to generate a sensor signal that is representative of an operating parameter of the machine. The high frequency sensors have a required high frequency sampling rate. The testing system also includes a notification device configured to generate a notification indicating the operating parameter monitored by the high frequency sensors has exceeded a predefined threshold value. The testing system also includes a data acquisition control module configured to monitor the plurality of sensors at a first sampling rate and a monitoring control module in electronic communication with the notification device. The monitoring control module is configured to monitor the high frequency sensors at a second sampling rate that is greater than the first sampling rate and at least equal to the required high frequency sampling rate. The monitoring control module is caused to determine a maximum value of the sensor signal over a predefined time interval and compare the maximum value of the sensor signal with the predefined threshold value. The monitoring control module is also caused to determine the maximum value of the sensor signal exceeds the predefined threshold value. In response to determining the maximum value of the sensor signal exceeds the predefined threshold value, the monitoring control module is caused to instruct the notification device to generate the notification.

In another aspect, a method of generating a notification indicating an operating parameter of a machine under test has exceeded a predefined threshold value is disclosed. The method includes monitoring, by a data acquisition control module, a plurality of sensors at a first sampling rate. The method also includes monitoring, by a monitoring control module, a sensor signal generated by one or more high frequency sensors at a second sampling rate, where the second sampling rate is greater than the first sampling rate and at least equal to a required high frequency sampling rate of the high frequency sensors. The method also includes determining, by the monitoring control module, a maximum value of the sensor signal over a predefined time interval and comparing, by the monitoring control module, the maximum value of the sensor signal with the predefined threshold value. The method also includes determining, by the monitoring control module, the maximum value of the sensor signal exceeds the predefined threshold value. Finally, in response to determining the maximum value of the sensor signal exceeds the predefined threshold value, the method includes instructing a notification device to generate the notification by the monitoring control module.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The present disclosure is directed towards a monitoring system for a machine under test. A primary data acquisition system is provided to monitor a plurality of sensors that each correspond to an operating parameter of the machine. However, the data acquisition system samples data from the sensors at a first sampling rate that is less than a sampling rate required by some of the sensors, which are referred to as high frequency sensors. Instead, the monitoring system is provided for monitoring the high frequency sensors at a second sampling rate. The second sample rate of the monitoring system is greater than the first sampling rate of the data acquisition system and is at least equal to the required sampling rate of the sensors. Therefore, the data acquisition system is the primary system for monitoring data. Moreover, the monitoring system acts as a secondary system that is provided for monitoring only the high frequency sensors.

The monitoring system also includes a notification device configured to generate a notification indicating the operating parameter monitored by the high frequency sensors has exceeded a predefined threshold value. The notification alerts an operator or other individual overseeing operation of the machine, and he or she may perform corrective action or perform other countermeasures in response to receiving the notification.

The following description is merely exemplary in nature and is not intended to limit the present disclosure, application, or uses.

Figure 1:
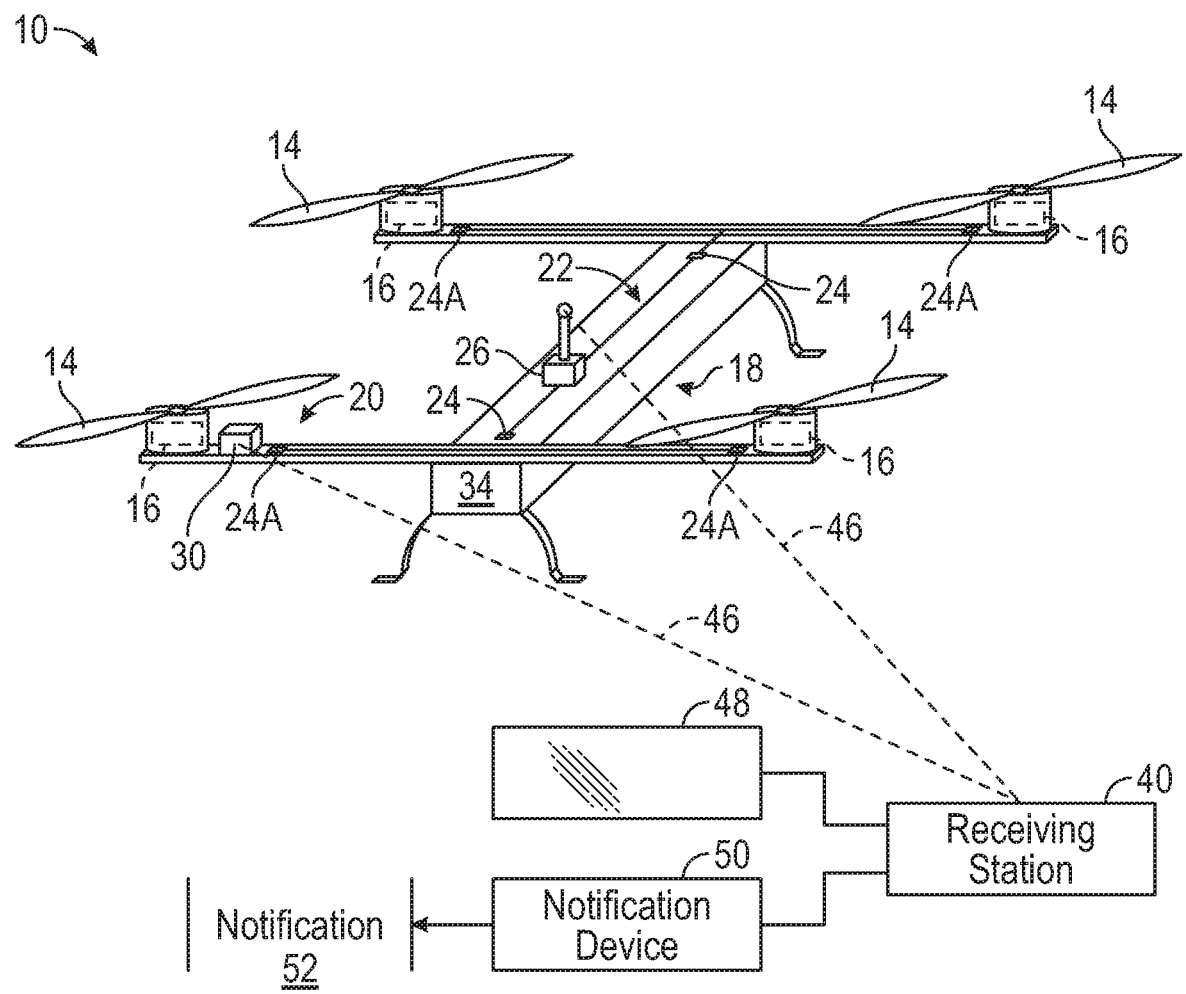
FIG. 1 is an illustration of a machine under test, one or more high frequency sensors, a primary data acquisition system, and the disclosed secondary monitoring system, according to an exemplary embodiment.

Referring to FIG. 1, a schematic diagram of a machine 10 under test is illustrated. In the non-limiting embodiment as shown, the machine 10 is a quadrotor helicopter having four rotors 14 that are each driven by a corresponding motor 16 (shown in phantom line). A testing system 22 monitors various operating parameters of the machine 10. The testing system 22 includes a data acquisition system 18, a monitoring system 20, and a plurality of sensors 24. The plurality of sensors 24 are each configured to collect data representing an operating parameter of the machine 10. A portion of the plurality of sensors 24 are each in electronic communication with a data acquisition control module 26 that is part of the data acquisition system 18, and a remaining portion of the plurality of sensors 24 are one or more high frequency sensors 24A. The high frequency sensors 24A require a higher sampling rate when compared to the sensors 24. It is to be appreciated that there are no specific frequency ranges that are used to classify a sensor 24 as a high frequency sensor 24A. Instead, the high frequency sensors 24A are classified based on their required sampling rates relative to the other sensors 24 that are part of the testing system 22. That is, the high frequency sensors 24A have a required high frequency sampling rate that is greater than a sampling rate of the other sensors 24 that are part of the testing system 22.

The required sampling rate of each sensor 24 is based in part on the Nyquist frequency of a signal that is being monitored by the particular sensor 24. The high frequency sensors 24A measure operating parameters that generate higher frequency signals such as, but not limited to, linear acceleration, strain upon an object that is part of the machine 10, and a rotational acceleration and a rotational speed of each motor 16 of the machine 10. In contrast, the other sensors 24 measure operating parameters that generate lower frequency signals such as, but are not limited to, an ambient temperature, pressure, and humidity, a temperature, pressure, and liquid level for various fluids, vehicle heading, actuator altitude, vehicle attitude, actuator positions, and airspeed. The data acquisition control module 26 of the data acquisition system 18 is in electronic communication with the sensors 24, and a monitoring control module 30 of the monitoring system 20 is in electronic communication with only the high frequency sensors 24A. The data acquisition control module 26 of the data acquisition system 18 is unable to monitor the high frequency sensors 24A at the required sampling rate. Instead, the monitoring system 20 acts as a secondary monitoring system and is provided for monitoring the high frequency sensors 24A at their required sampling rates.

In the embodiment as shown in FIG. 1, the data acquisition control module 26 of the data acquisition system 18 and the monitoring control module 30 of the monitoring system 20 are both mounted upon a frame 34 of the machine 10. Although FIG. 1 illustrates the machine 10 as a quadrotor helicopter, it is to be appreciated that the machine 10 is not limited to any particular machine undergoing a test procedure. For example, in an embodiment the machine 10 is another type of vehicle such as, but not limited to, an automobile, a passenger aircraft, an unmanned aerial vehicle, a marine vehicle, or a satellite. However, it is also to be appreciated that the machine 10 is not limited to a vehicle. For example, in another embodiment, the machine 10 is located on the floor of a manufacturing facility, and the monitoring system 20 is used to monitor variables such as bearing wear or binding of actuators.

Continuing to refer to FIG. 1, in one non-limiting embodiment, the data acquisition system 18 is a telemetry system. The data acquisition control module 26 of the data acquisition system 18 and the monitoring control module 30 of the monitoring system 20 are both in electronic communication with a receiving station 40. In the embodiment as shown in FIG. 1, both the control modules 26, 30 are in electronic communication with the receiving station 40 by a wireless network 46, and the machine 10 is remotely located from the receiving station 40. For example, if the machine 10 is an aircraft, then the receiving station 40 represents a ground-based control station. However, in alternative embodiment, the receiving station 40 is located relatively nearby the control modules 26, 30 or is on-board the machine 10, and therefore the receiving station 40 is in electronic communication with the control modules 26, 30 by a data bus.

In one embodiment, an individual is located at the receiving station 40 to oversee operation of the machine 10. In one example, the receiving station 40 includes a monitor 48 for displaying data collected by the data acquisition system 18 that the individual may view. A notification device 50 is located at the receiving station 40 and is in electronic communication with the monitoring control module 30 of the monitoring system 20. For example, in the embodiment as shown, the notification device 50 is in wireless communication with the monitoring control module 30 of the monitoring system 20 by the wireless network 46. The notification device 50 is configured to generate a notification 52 that indicates that an operating parameter of the machine 10 being monitored by one of the high frequency sensors 24A has exceeded a predefined threshold value. Once the individual received the notification, he or she may take corrective actions. For example, if the operating parameter being monitored by the monitoring control module 30 of the monitoring system 20 is the rotational acceleration of one of the motors 16 of the machine 10, then the individual may change the commanded position of the motor 16, which in turn reduces the acceleration of the motor 16.

The notification 52 is any type of stimulus configured to capture the attention of the individual at the receiving station 40 and includes one or more of the following: a visual device, an audio device, and a haptic device. The visual device generates a visual notification in the form of text, graphics, or light. For example, the notification 52 may include text, images, or both upon the monitor 48. In another example, the notification device 50 includes one or more light-emitting elements that are illuminated to create the notification 52. For example, in one embodiment, the notification device 50 includes a green lamp, a yellow lamp, and a red lamp, and the red lamp is illuminated to indicate an operating parameter of the machine has exceeded the predefined threshold value. In another embodiment, the notification device 50 is an audio device such as, for example, a speaker or an alarm for generating sound to capture the attention of the individual. In yet another embodiment, the notification device 50 includes a haptic device that generates a tactile sensation for capturing the attention of the individual.

Although FIG. 1 illustrates the notification device 50 located in a location that is remote from the machine 10, in another embodiment the notification device 50 is on-board the machine 10. For example, the notification device 50 is located on-board the machine 10 and is in electronic communication with the monitoring control module 30 of the monitoring system 20 by a data bus. If the machine 10 is an aircraft, then the notification device 50 may be placed adjacent to the pilot. For example, in one embodiment, the notification device 50 includes one or more lamps that illuminate to create the notification 52. The notification device 50 is placed in an area where the pilot may easily view the lamp illuminating.

The data acquisition control module 26 of the data acquisition system 18 is configured to monitor the sensors 24 at a first sampling rate. The first sampling rate of the data acquisition control module 26 is at least equal to a required sampling rate of the sensors 24 used to monitor the machine 10. However, it is to be appreciated the first sampling rate of the data acquisition control module 26 is less than a required high frequency sampling rate required by the high frequency sensors 24A. Thus, the monitoring system 20 is provided, and is configured to monitor the high frequency sensors 24A at a second sampling rate. The second sampling rate is greater than the first sampling rate of the data acquisition system 18 and at least equal to the required high frequency sampling rate. In one embodiment, the first sampling rate is significantly less than the second sampling rate. In one illustrative example, the first sampling rate is about 100 Hertz, and the second sampling rate is about 2500 Hertz. Therefore, the first sampling rate is at least 100 Hertz, but is less than 2500 Hertz, and the second sampling rate is at least 2500 Hertz.

Figure 2:
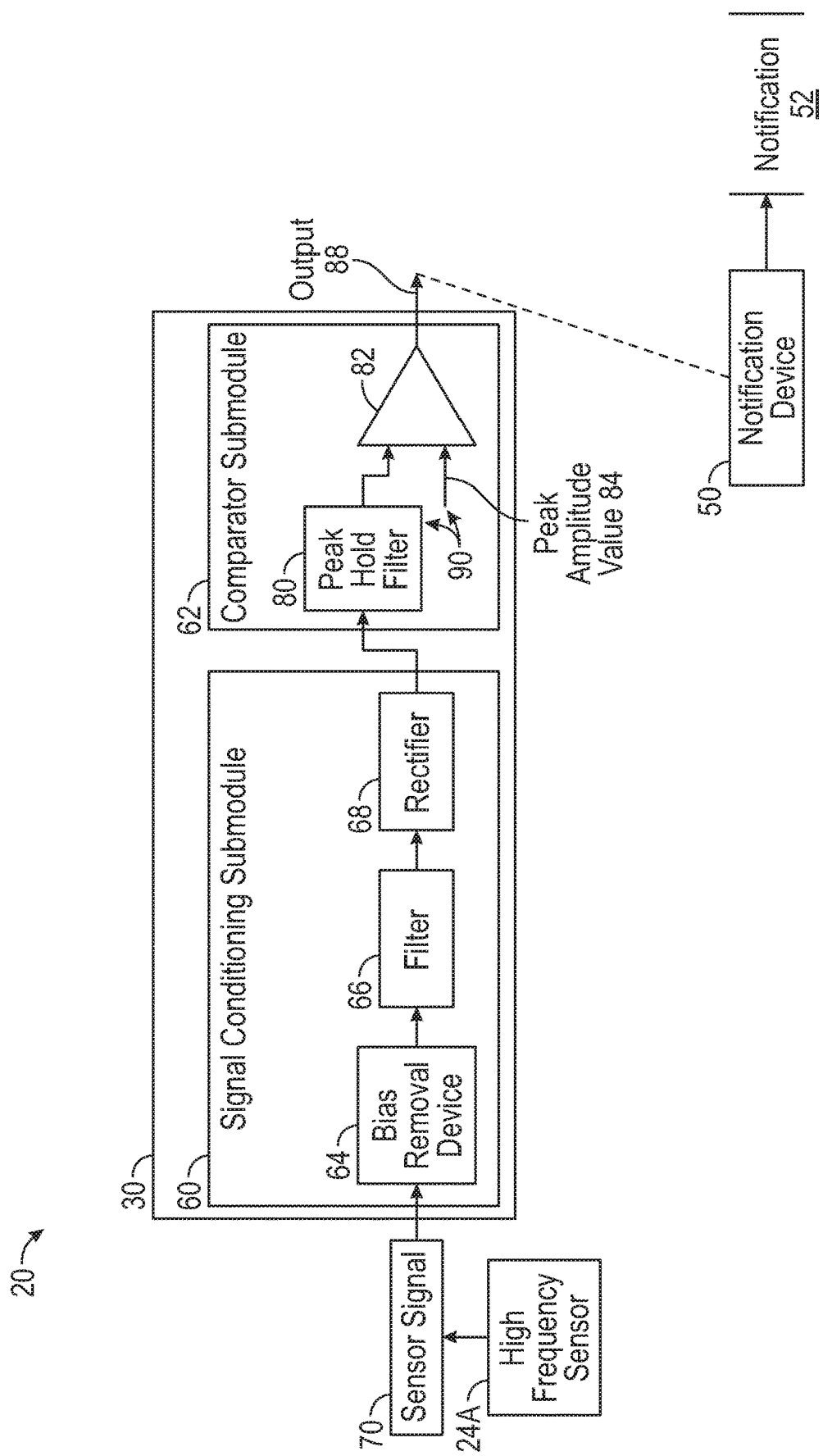
FIG. 2 is a schematic diagram of the monitoring system shown in FIG. 1, where the monitoring system determines a peak amplitude value of a sensor signal, according to an exemplary embodiment.

FIG. 2 is a schematic diagram of one embodiment of the monitoring system 20 shown in FIG. 1. The monitoring system 20 shown in FIG. 2 is an amplitude-based system for ensuring that a peak instantaneous value of the sensor signal 70 over a selected frequency range does not exceed the predefined threshold value over a predefined time interval. In contrast, the monitoring system 20 shown in FIG. 3 ensures that the root mean square (RMS) of the sensor signal 70 over a selected frequency range does not exceed the predefined threshold value over the predefined time interval. The predefined threshold value is a user-defined variable that is adjustable by a user. In other words, a user may adjust the predefined threshold value as testing is being performed.

Turning back to FIG. 2, the monitoring control module 30 of the monitoring system 20 in electronic communication with one or more of the high frequency sensors 24A and the notification device 50. As mentioned above, the monitoring control module 30 may be in electronic communication with the notification device 50 by either the wireless network 46 (FIG. 1) or a data bus. The monitoring control module 30 includes a signal conditioning submodule 60 and a comparator submodule 62 in electronic communication with one another. The signal conditioning submodule 60 includes a bias removal device 64, a filter 66, and a rectifier 68 that are in electronic communication with one another and the one or more high frequency sensors 24A. The one or more high frequency sensors 24A are configured to generate a sensor signal 70 representative of an operating parameter of the machine 10.

The bias removal device 64 receives the sensor signal 70 as input and removes a DC bias from the sensor signal 70. The bias removal device 64 may include, but is not limited to, a high-pass filter or an AC coupler. The sensor signal 70 is then sent to the filter 66. The filter 66 is configured to isolate a region of interest within the frequency domain of the sensor signal 70. In other words, the filter 66 is configured to pass portions of the sensor signal 70 that fall within a selected frequency range and attenuate portions of the sensor signal 70 that fall outside of the selected frequency range. The selected frequency range is a user-defined variable and is adjusted based on the specific application of the monitoring system 20.

The filter 66 is a high pass filter, a low pass filter, or a bandpass filter. It is to be appreciated that the specific type of filter (i.e., high pass, low, pass, or bandpass) is selected based on the region of interest within the frequency domain of the sensor signal 70. For example, if the motor 16 (FIG. 1) exhibits a peak vibration within a specific frequency band, then a bandpass filter is employed. The sensor signal 70 is then sent to the rectifier 68. The rectifier 68 is a full-wave rectifier configured to reverse a negative polarity of the sensor signal 70. The sensor signal is then sent to the comparator submodule 62.

The comparator submodule 62 includes a peak hold filter 80 and a comparator 82 that are in electronic communication with one another. The peak hold filter 80 is configured to determine a maximum value of the sensor signal 70 over the defined time interval. Specifically, the peak hold filter 80 is configured to hold a peak amplitude value of the sensor signal 70 over the defined time interval. The predefined time interval is a function of an output rate of the data acquisition control module 26. Specifically, the predefined time interval is inversely proportional to the first sampling rate of the data acquisition control module 26. For example, if the data acquisition control module 26 has a sampling rate of 100 Hertz, then the predefined time interval is $\frac{1}{100}$ a second. The peak amplitude value of the sensor signal 70 is then sent to the comparator 82.

The comparator 82 is configured to compare the maximum value of the sensor signal 70 with the predefined threshold value. The comparator 82 generates an output 88 based on comparing two inputs 90, the maximum value of the sensor signal 70 and the predefined threshold value. In the embodiment as shown in FIG. 2, the predefined threshold value represents a peak amplitude value 84 of the sensor signal 70. The peak amplitude value 84 of the sensor signal 70 represents a maximum instantaneous value of the operating parameter being monitored by the specific high frequency sensor 24A. The peak amplitude value 84 of the sensor signal 70 is a user-defined variable that may be adjusted by a user.

In some instances, the comparator 82 determines the maximum value of the sensor signal 70 exceeds the predefined threshold value (i.e., the peak amplitude value 84). Accordingly, the output 88 indicates the maximum value of the sensor signal 70 is the larger value of the two inputs 90 into the comparator 82. In response to determining the maximum value of the sensor signal 70 exceeds the predefined threshold value, the monitoring control module 30 instructs the notification device 50 to generate the notification 52. Specifically, the output 88 of the comparator 82 is sent over the wireless network 46 (or a data bus depending upon the application) if the maximum value of the sensor signal 70 exceeds the peak amplitude value. In response to receiving the output 88 from the comparator 82 of the monitoring control module 30, the notification device 50 generates the notification 52. The notification 52 captures the attention of the individual, who may then take corrective action.

Figure 3:
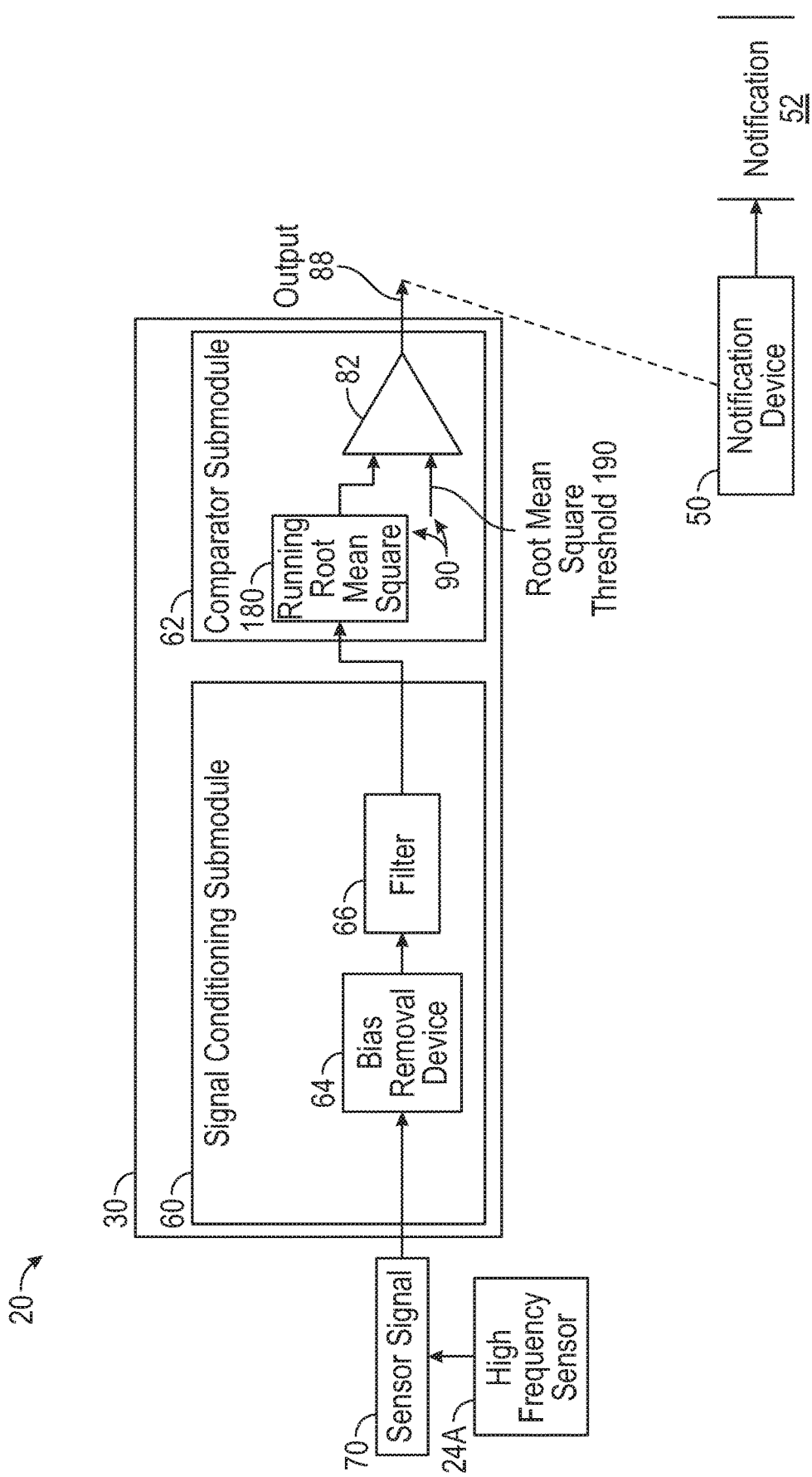
FIG. 3 is another embodiment of the monitoring system shown in FIG. 1, where the monitoring system determines a running root mean square of the sensor signal, according to an exemplary embodiment.

Referring now to FIG. 3, an alternative embodiment of the monitoring control module 30 for the monitoring system 20 is shown. The monitoring control module 30 shown in FIG. 3 ensures the root mean square of the sensor signal 70 over a selected frequency range does not exceed a threshold root mean square value 190 value over the predefined time interval. The monitoring control module 30 shown in FIG. 3 is similar to the embodiment as shown in FIG. 2, except the monitoring control module 30 for monitoring the root mean square of the sensor signal 70 omits the rectifier 68 (seen in FIG. 2), and instead of a peak hold filter 80, a running root mean square block 180 is used instead.

As seen in FIG. 3, the sensor signal 70 is then sent from the filter 66 of the signal conditioning submodule 60 to the running root mean square block 180 of the comparator submodule 62. The running root mean square block 180 is configured to determine a root mean square for a sequence of values over the defined time interval. The root mean square of the sensor signal 70 is then sent to the comparator 82. In some instances, the comparator 82 determines the running root mean square of the sensor signal 70 exceeds the threshold root mean square value 190. The comparator 82 generates the output 88 indicating which of the two inputs 90, either the root mean square of the sensor signal 70 or the threshold root mean square value 190, is larger. In the embodiment as shown in FIG. 3, the maximum root mean square value 190 represents a maximum amount of energy within a specific frequency band of interest for which an operator is alerted. Specifically, the output 88 of the comparator 82 is sent over the wireless network 46 (or a data bus depending upon the application) if the root mean square of the sensor signal 70 exceeds the threshold root mean square value 190.

Figure 4:
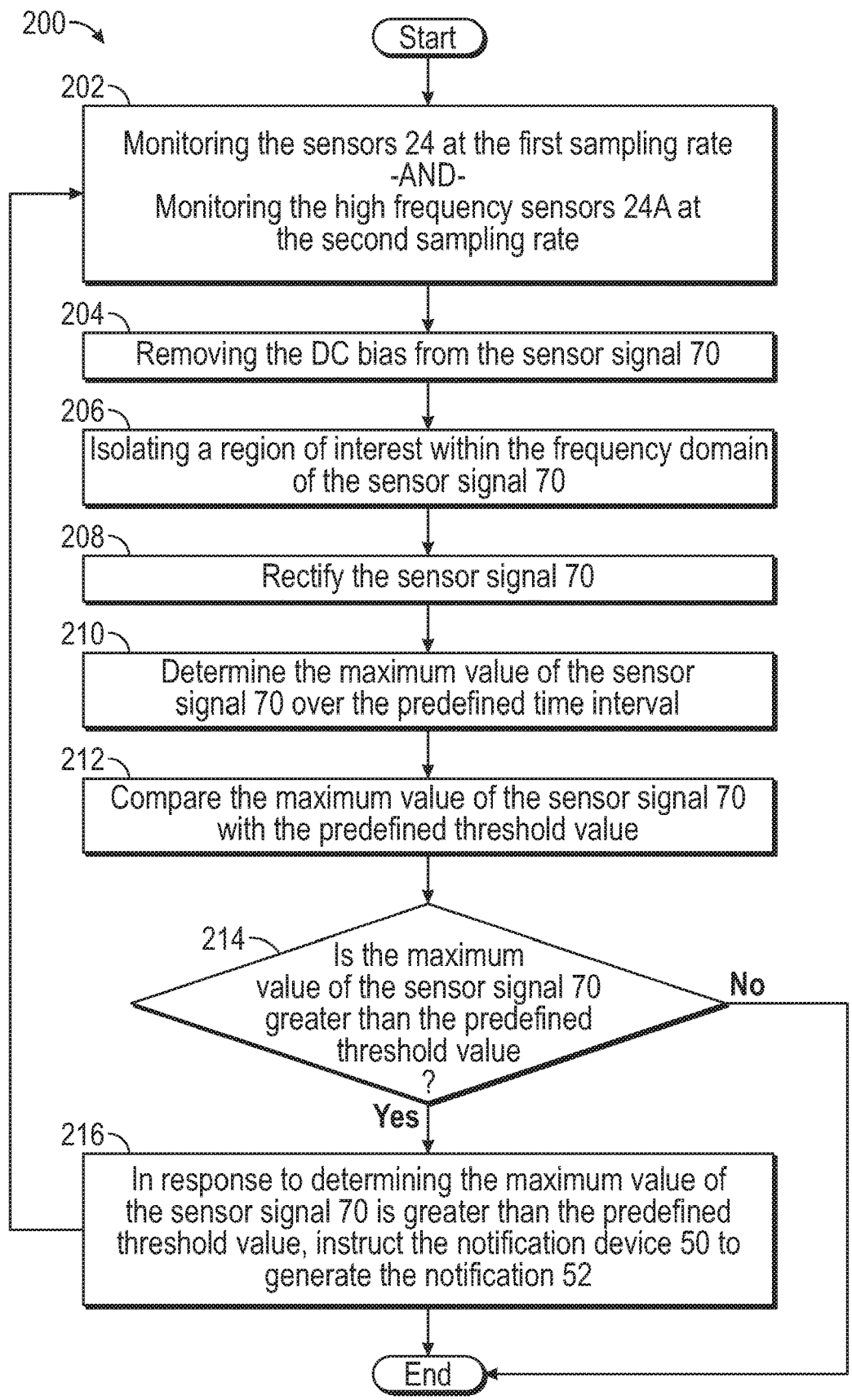
FIG. 4 is a process flow diagram illustrating a method for generating a notification in response to determining the high frequency sensors have exceeded a predefined threshold value, according to an exemplary embodiment.

FIG. 4 is an exemplary process flow diagram illustrating a method 200 for generating the notification 52 indicating an operating parameter of the machine 10 under test has exceeded the predefined threshold value. Referring generally to FIG. 1-4, the method 200 may begin in block 202. In block 202, the data acquisition control module 26 monitors one or more sensors 24 at the first sampling rate. At the same time, the monitoring control module 30 monitors the high frequency sensors 24A at the second sampling rate, where the second sampling rate is greater than the first sampling rate and at least equal to the required high frequency sampling rate of the high frequency sensors 24A. The method 200 may then proceed to block 204.

In block 204, the bias removal device 64 removes the DC bias from the sensor signal 70. The method 200 may then proceed to block 206.

In block 206, the filter 66 isolates a region of interest within the frequency domain of the sensor signal 70. In other words, the filter 66 is configured to pass portions of the sensor signal 70 that fall within a selected frequency range and attenuate portions of the sensor signal 70 that fall outside of the selected frequency range. The method 200 may then proceed to block 208.

In block 208, the rectifier 68 (shown in FIG. 2) rectifies the sensor signal 70 prior to the sensor signal 70 being compared with the predefined threshold value. It is to be appreciated that the block 208 and the rectifier are only employed in the embodiment as shown in FIG. 2, where the amplitude value of the sensor signal 70 is being analyzed. The method 200 may then proceed to block 210.

In block 210, the maximum value of the sensor signal 70 over the predefined time interval is determined. For example, in the embodiment as shown in FIG. 2, the peak hold filter 80 is configured to hold the peak amplitude value of the sensor signal 70 over the defined time interval. In the embodiment as shown in FIG. 3, the running root mean square block 180 is configured to determine a root mean square for a sequence of values over the defined time interval. The method 200 may then proceed to block 212.

In block 212, the maximum value of the sensor signal 70 is compared with the predefined threshold value by the comparator 82. For example, in the embodiment as shown in FIG. 2, the comparator 82 compares the maximum value of the sensor signal 70 with the peak amplitude value 84. In the embodiment as shown in FIG. 3, the comparator 82 compares the running root mean square of the sensor signal 70 with the threshold root mean square value 190. The method 200 may then proceed to block 214.

In block 214, the comparator 82 determines the maximum value of the sensor signal 70 exceeds the predefined threshold value. For example, in the embodiment as shown in FIG. 2, the comparator 82 determines the maximum value of the sensor signal 70 exceeds the peak amplitude value 84. In the embodiment as shown in FIG. 3, the comparator 82 determines the running root mean square of the sensor signal 70 exceeds the threshold root mean square value 190. The method 200 may then proceed to decision block 216.

In decision block 216, if the maximum value of the sensor signal 70 is less than the predefined threshold value, the method 200 may then terminate. However, in response to determining the maximum value of the sensor signal exceeds the predefined threshold value, the notification device 50 is instructed to generate the notification 52. The method 200 may then terminate or, alternatively, return to block 212 and repeat the process.

Referring generally to the figures, the disclosed secondary monitoring system provides an approach for converting a high frequency value of one of the operating parameters that exceeds its predefined limit into a low frequency indicator. The disclosed monitoring system also provides an approach for detecting when a high frequency operating parameter exceeds its threshold value that is not possible when only employing the data acquisition system. Moreover, in one embodiment, the monitoring system may be self-contained and does not require any external connections.

Figure 5:
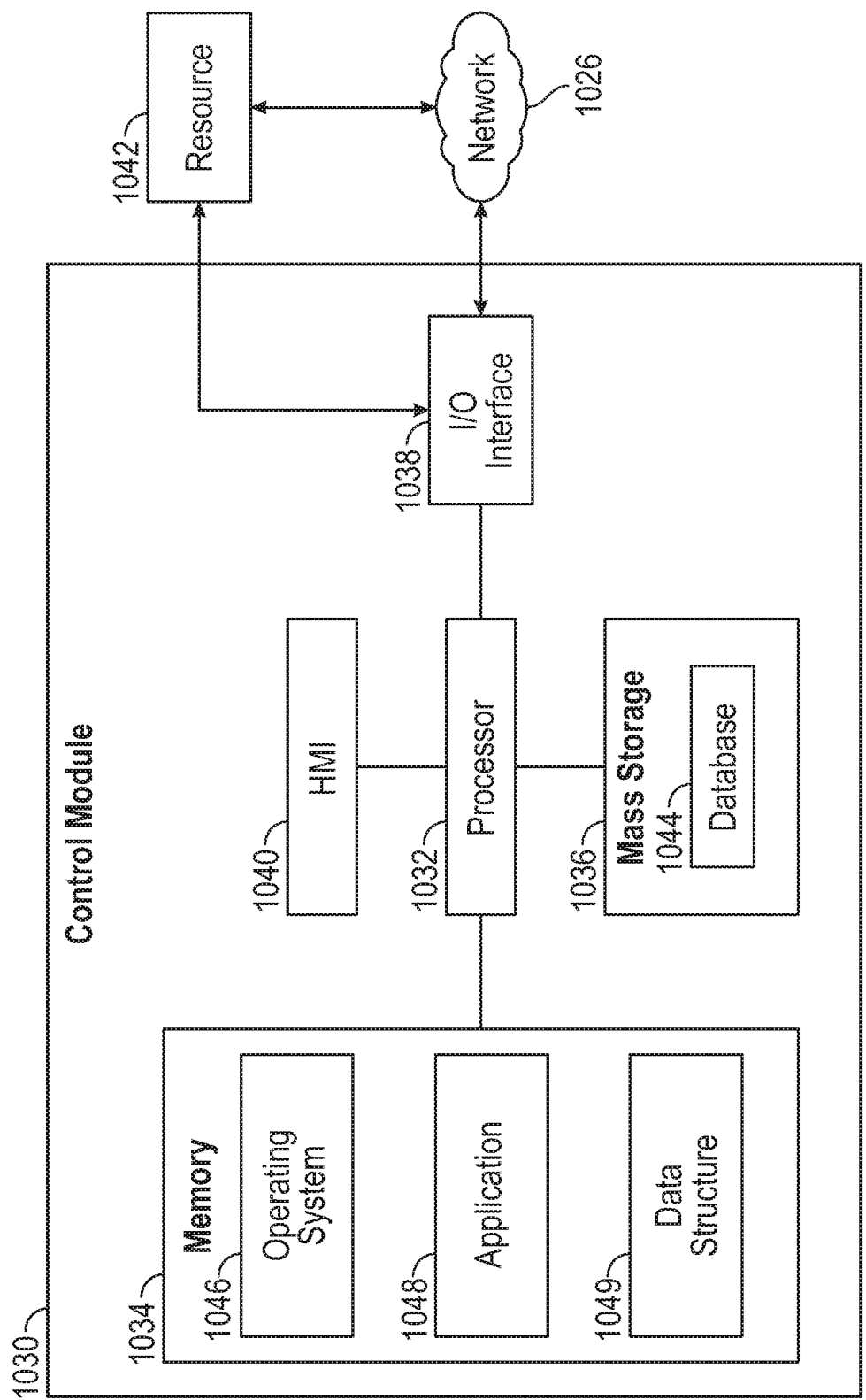
FIG. 5 is a computer system for the control modules shown in FIG. 1, according to an exemplary embodiment.

Referring to FIG. 5, the control modules 26 and 30 are implemented on one or more computer devices or systems, such as exemplary computer system 1030. The computer system 1030 includes a processor 1032, a memory 1034, a mass storage memory device 1036, an input/output (I/O) interface 1038, and a Human Machine Interface (HMI) 1040. The computer system 1030 is operatively coupled to one or more external resources 1042 via the network 1026 or I/O interface 1038. External resources may include, but are not limited to, servers, databases, mass storage devices, peripheral devices, cloud-based network services, or any other suitable computer resource that may be used by the computer system 1030.

The processor 1032 includes one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 1034. Memory 1034 includes a single memory device or a plurality of memory devices including, but not limited to, read-only memory (ROM), random access memory (RAM), volatile memory, non-volatile memory, static random-access memory (SRAM), dynamic random-access memory (DRAM), flash memory, cache memory, or any other device capable of storing information. The mass storage memory device 1036 includes data storage devices such as a hard drive, optical drive, tape drive, volatile or non-volatile solid-state device, or any other device capable of storing information.

The processor 1032 operates under the control of an operating system 1046 that resides in memory 1034. The operating system 1046 manages computer resources so that computer program code embodied as one or more computer software applications, such as an application 1048 residing in memory 1034, may have instructions executed by the processor 1032. In an alternative example, the processor 1032 may execute the application 1048 directly, in which case the operating system 1046 may be omitted. One or more data structures 1049 also reside in memory 1034, and may be used by the processor 1032, operating system 1046, or application 1048 to store or manipulate data.

The I/O interface 1038 provides a machine interface that operatively couples the processor 1032 to other devices and systems, such as the network 1026 or external resource 1042. The application 1048 thereby works cooperatively with the network 1026 or external resource 1042 by communicating via the I/O interface 1038 to provide the various features, functions, applications, processes, or modules comprising examples of the disclosure. The application 1048 also includes program code that is executed by one or more external resources 1042, or otherwise rely on functions or signals provided by other system or network components external to the computer system 1030. Indeed, given the nearly endless hardware and software configurations possible, persons having ordinary skill in the art will understand that examples of the disclosure may include applications that are located externally to the computer system 1030, distributed among multiple computers or other external resources 1042, or provided by computing resources (hardware and software) that are provided as a service over the network 1026, such as a cloud computing service.

The HMI 1040 is operatively coupled to the processor 1032 of computer system 1030 in a known manner to allow a user to interact directly with the computer system 1030. The HMI 1040 may include video or alphanumeric displays, a touch screen, a speaker, and any other suitable audio and visual indicators capable of providing data to the user. The HMI 1040 also includes input devices and controls such as an alphanumeric keyboard, a pointing device, keypads, pushbuttons, control knobs, microphones, etc., capable of accepting commands or input from the user and transmitting the entered input to the processor 1032.

A database 1044 may reside on the mass storage memory device 1036 and may be used to collect and organize data used by the various systems and modules described herein. The database 1044 may include data and supporting data structures that store and organize the data. In particular, the database 1044 may be arranged with any database organization or structure including, but not limited to, a relational database, a hierarchical database, a network database, or combinations thereof. A database management system in the form of a computer software application executing as instructions on the processor 1032 may be used to access the information or data stored in records of the database 1044 in response to a query, where a query may be dynamically determined and executed by the operating system 1046, other applications 1048, or one or more modules.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A testing system for monitoring a machine under test, the testing system comprising:
    plurality of sensors configured to collect data representing an operating parameter of the machine, wherein the plurality of sensors include one or more high frequency sensors configured to generate a sensor signal that is representative of an operating parameter of the machine, wherein the high frequency sensors have a required high frequency sampling rate;
    a notification device configured to generate a notification indicating the operating parameter monitored by the high frequency sensors has exceeded a predefined threshold value;
    a data acquisition control module configured to monitor the plurality of sensors at a first sampling rate; and
    a monitoring control module in electronic communication with the notification device, the monitoring control module configured to monitor the high frequency sensors at a second sampling rate that is greater than the first sampling rate and at least equal to the required high frequency sampling rate, wherein the monitoring control module is caused to:
    determine a maximum value of the sensor signal over a predefined time interval;
    compare the maximum value of the sensor signal with the predefined threshold value;
    determine the maximum value of the sensor signal exceeds the predefined threshold value; and
    in response to determining the maximum value of the sensor signal exceeds the predefined threshold value, instruct the notification device to generate the notification.

2. The testing system of claim 1, wherein the predefined threshold value represents a peak amplitude value of the sensor signal.

3. The testing system of claim 2, wherein the predefined time interval is inversely proportional to the first sampling rate of the data acquisition control module.

4. The testing system of claim 2, further comprising a rectifier in electronic communication with the high frequency sensors.

5. The testing system of claim 4, wherein the rectifier is configured to rectify the sensor signal prior to being compared with the predefined threshold value.

6. The testing system of claim 1, wherein the predefined threshold value represents a root mean square value of the sensor signal.

7. The testing system of claim 1, wherein the data acquisition control module is in electronic communication with a receiving station by either a data bus or a wireless network connection.

8. The testing system of claim 1, further comprising a bias removal device in electronic communication with the high frequency sensors, wherein the bias removal device is configured to remove a DC bias from the sensor signal.

9. The testing system of claim 1, wherein the sensor signal represents one of the following: linear acceleration, rotational acceleration, strain upon an object, and rotational speed.

10. The testing system of claim 1, wherein the predefined threshold value and the predefined time interval are user-defined variable.

11. The testing system of claim 1, further comprising a filter in electronic communication with the high frequency sensors, wherein the filter is configured to isolate a region of interest within a frequency domain of the sensor signal.

12. The testing system of claim 11, wherein the filter is selected from the group comprising of: a low pass filter, a high pass filter, and a bandpass filter.

13. The testing system of claim 1, wherein the predefined threshold value is a user-defined variable that is adjustable by a user.

14. The testing system of claim 1, wherein the notification device includes one or more of the following: one or more light-emitting elements, an audio device, and a haptic device.

15. The testing system of claim 1, wherein the machine is a vehicle.

16. The testing system of claim 1, wherein the testing system includes a plurality of sensors, and wherein the high frequency sensors have a required high frequency sampling rate that is greater than a sampling rate than a remaining portion of the sensors that are part of the testing system.

17. A method of generating a notification indicating an operating parameter of a machine under test has exceeded a predefined threshold value, the method comprising:

monitoring, by a data acquisition control module, a plurality of sensors at a first sampling rate;

monitoring, by a monitoring control module, a sensor signal generated by one or more high frequency sensors at a second sampling rate, wherein the second sampling rate is greater than the first sampling rate and at least equal to a required high frequency sampling rate of the high frequency sensors;

determining, by the monitoring control module, a maximum value of the sensor signal over a predefined time interval;

comparing, by the monitoring control module, the maximum value of the sensor signal with the predefined threshold value;

determining, by the monitoring control module, the maximum value of the sensor signal exceeds the predefined threshold value; and in response to determining the maximum value of the sensor signal exceeds the predefined threshold value, instructing a notification device to generate the notification by the monitoring control module.

18. The method of claim 17, wherein the predefined threshold value represents a peak amplitude value of the sensor signal.

19. The method of claim 17, wherein the predefined threshold value represents a root mean square value of the sensor signal.

20. The method of claim 17, further comprising:
isolating a region of interest within a frequency domain of the sensor signal.

* * * * *

UNITED STATES PATENT AND TRADEMARK OFFICE
CERTIFICATE OF CORRECTION

PATENT NO. : 11,480,603 B2
APPLICATION NO. : 16/825626
DATED : October 25, 2022
INVENTOR(S) : Steven F Griffin et al.

It is certified that error appears in the above-identified patent and that said Letters Patent is hereby corrected as shown below:

On the Title Page

In item (72), the Inventors read:
Steven F Griffin, Kihei, HI (US); Matthew Scot Stauffer, Ladson, SC (US); Matthew Novick, Philadelphia, PA (US); Daryn D Kono, Pukalani, HI (US); Kevin P Moore, Pukalami, HI (US)

Should read:
Steven F. Griffin, Kihei, HI (US); Matthew Scot Stauffer, Ladson, SC (US); Matthew Novick, Philadelphia, PA (US); Daryn D. Kono, Pukalani, HI (US); Kevin P. Moore, Pukalami, HI (US)

Signed and Sealed this
Twenty-third Day of January, 2024

Katherine Kelly Vidal
*Director of the United States Patent and Trademark Office*